United States Patent
Covington et al.

(10) Patent No.: US 7,576,948 B2
(45) Date of Patent: Aug. 18, 2009

(54) MAGNETIC FIELD READ SENSOR BASED ON THE EXTRAORDINARY HALL EFFECT

(75) Inventors: Mark William Covington, Pittsburgh, PA (US); Thomas Francis Ambrose, Sewickley, PA (US); Michael Allen Seigler, Pittsburgh, PA (US); Hua Zhou, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 396 days.

(21) Appl. No.: 11/360,243

(22) Filed: Feb. 23, 2006

(65) Prior Publication Data

US 2007/0195452 A1 Aug. 23, 2007

(51) Int. Cl.
*G11B 5/37* (2006.01)
(52) U.S. Cl. ..................................... 360/112
(58) Field of Classification Search ............... 360/112, 360/313, 314
See application file for complete search history.

(56) References Cited

U.S. PATENT DOCUMENTS

| | | | |
|---|---|---|---|
| 3,787,638 A * | 1/1974 | Murai | 360/112 |
| 4,507,651 A | 3/1985 | Boll et al. | |
| 4,907,113 A | 3/1990 | Mallary | |
| 5,169,485 A | 12/1992 | Allen, Jr. et al. | |
| 5,255,141 A | 10/1993 | Valstyn et al. | |
| 5,652,445 A | 7/1997 | Johnson | |
| 5,747,180 A | 5/1998 | Miller et al. | |
| 6,008,643 A * | 12/1999 | Mani et al. | 324/251 |
| 6,121,647 A * | 9/2000 | Yano et al. | 257/295 |
| 6,195,228 B1 | 2/2001 | Bennett et al. | |
| 6,727,537 B2 | 4/2004 | Wunderlich | |
| 6,744,086 B2 | 6/2004 | Daughton et al. | |
| 6,768,300 B2 | 7/2004 | Shirakawa et al. | |
| 6,791,792 B2 * | 9/2004 | Takahashi | 360/112 |
| 7,110,216 B2 * | 9/2006 | Gerber | 360/112 |
| 2004/0228100 A1* | 11/2004 | Wright | 361/794 |
| 2005/0007694 A1* | 1/2005 | Takahashi | 360/112 |
| 2005/0018345 A1* | 1/2005 | Gerber | 360/112 |
| 2005/0088787 A1* | 4/2005 | Takahashi et al. | 360/324.2 |
| 2006/0176620 A1* | 8/2006 | Ravelosona et al. | 360/324.2 |
| 2007/0253116 A1* | 11/2007 | Takahashi | 360/313 |
| 2008/0037180 A1* | 2/2008 | Boone et al. | 360/313 |

OTHER PUBLICATIONS

G.X. Miao and G. Xiao, Appl. Phys. Lett. 85, 73 (2004).

* cited by examiner

*Primary Examiner*—Jefferson Evans
(74) *Attorney, Agent, or Firm*—Westman, Champlin & Kelly, P.A.

(57) ABSTRACT

A magnetic field sensor includes a metallic bar coupled to a substrate. Current leads are adapted to provide current to the ferromagnetic bar. Voltage leads are coupled to the ferromagnetic bar to sense an induced Hall voltage therein.

21 Claims, 12 Drawing Sheets

ABS

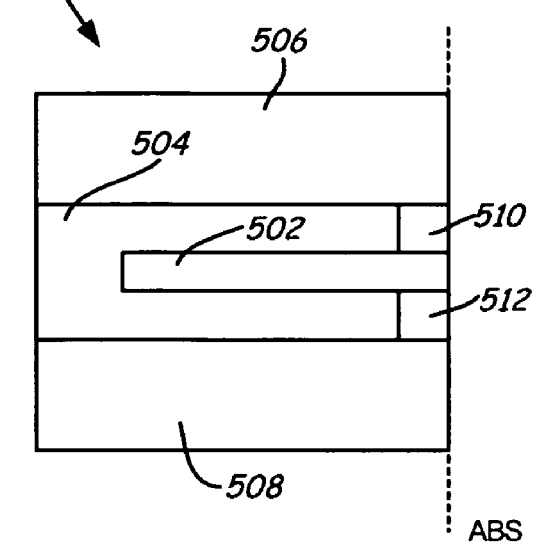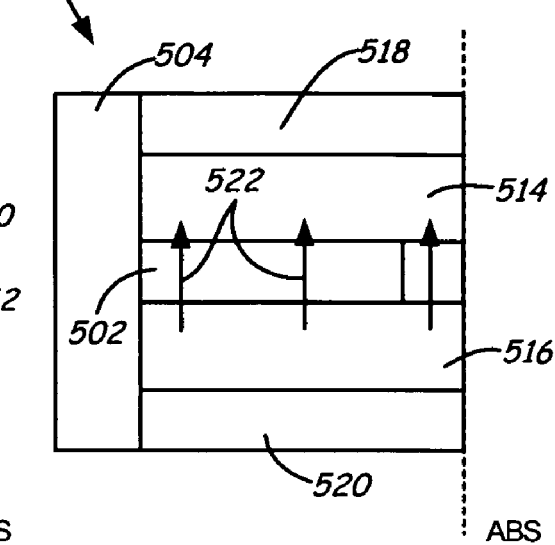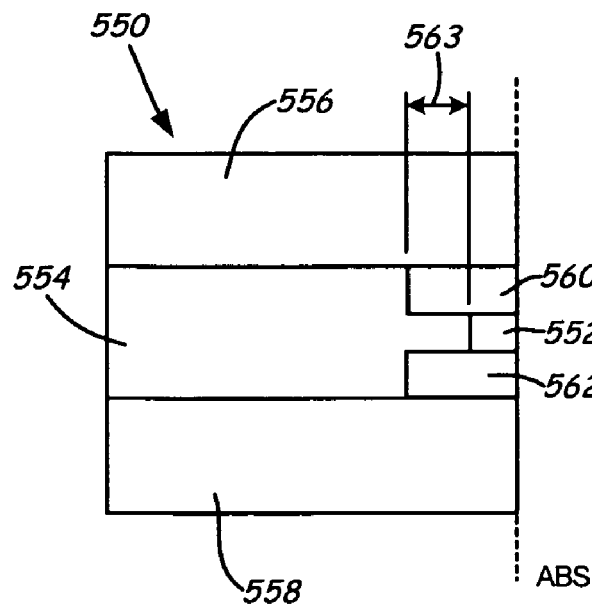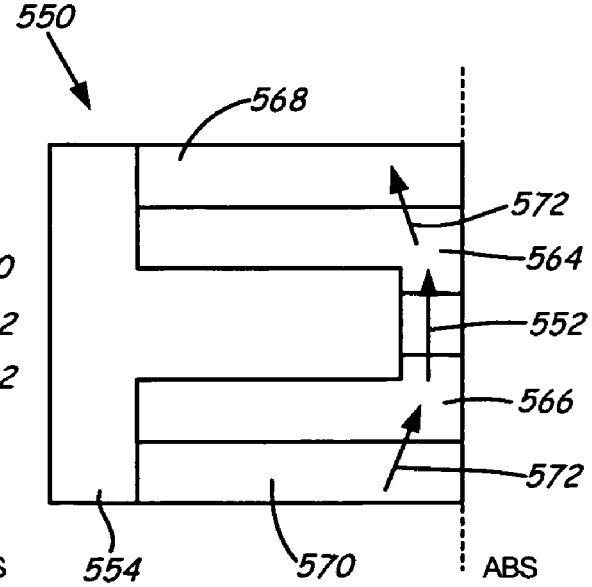

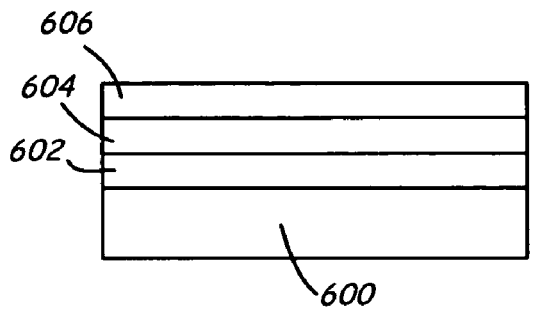
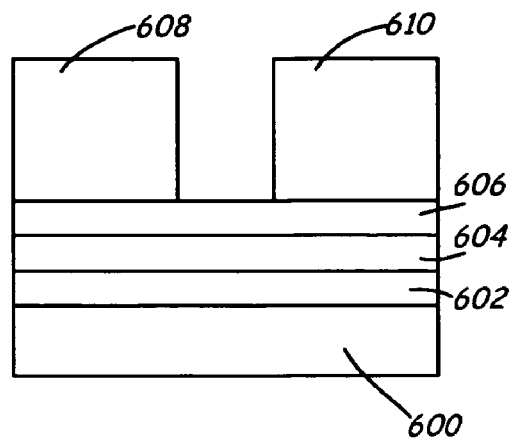
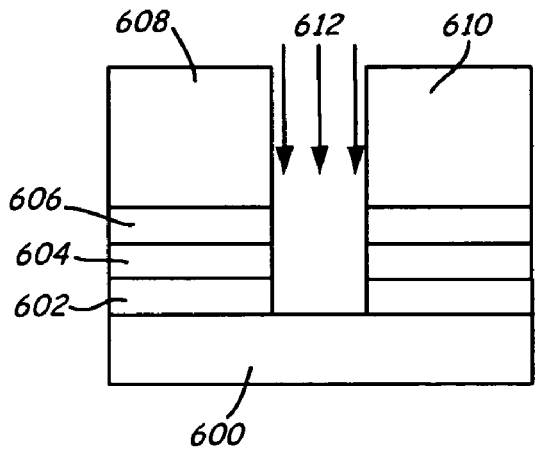
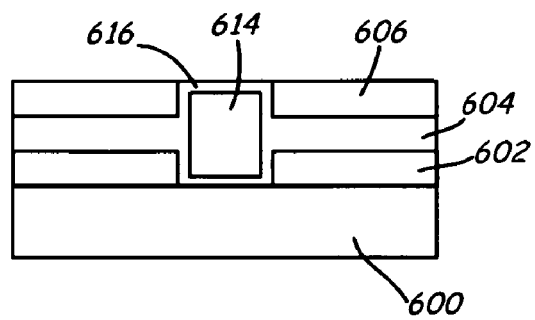
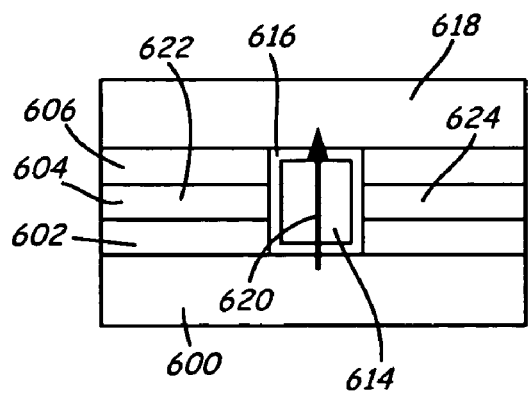
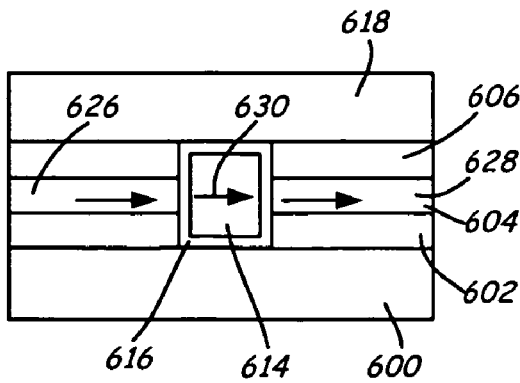

MAGNETIC FIELD READ SENSOR BASED ON THE EXTRAORDINARY HALL EFFECT

BACKGROUND OF THE INVENTION

In an electronic data storage and retrieval system, a transducing head typically includes a writer for storing information on a storage medium and a reader for retrieving that information from the storage medium. In a magnetic data storage system, the reader typically consists of two shields and a magnetoresistive (MR) sensor positioned between the shields. Magnetic flux from the surface of the storage medium causes rotation of the magnetization vector of a sensing layer of the MR sensor, which in turn causes a change in electrical resistivity of the MR sensor. This change in resistivity of the MR sensor can be detected by passing a current through the MR sensor and measuring a voltage across the MR sensor. External circuitry then converts the voltage information into an appropriate format and manipulates that information as necessary.

In magnetic recording, it is desirable to improve the areal density at which information can be recorded and reliably read. This desire has led to a trend toward shorter bit length along a magnetic recording track and a shrinking track width. Currently, readers are based on multilayers of magnetic and non-magnetic material that produce giant magnetoresistance (GMR). These readers are biased with an electrical current that predominantly flows in the plane (CIP) of the thin film multilayer. Similar designs based on GMR and tunneling magnetoresistance (TMR) have the bias current flow perpendicular to the plane (CPP) of the multilayer. Under high areal densities, CIP-GMR readers can have difficulty producing a large enough read-back amplitude. Additionally, CPP-GMR and TMR readers can have large amounts of noise. The magnetoresistance from these multi-layer technologies can be dependent on having adequate interfaces between layers in order to provide a high signal-to-noise ratio (SNR). This situation places constraints on deposition tools when creating a reader.

SUMMARY OF THE INVENTION

A magnetic field sensor includes a metallic bar coupled to a substrate. Current leads are adapted to provide current to the ferromagnetic bar. Voltage leads are coupled to the ferromagnetic bar to sense an induced Hall voltage therein.

Other features and benefits that characterize embodiments of the present invention will be apparent upon reading the following detailed description and review of the associated drawings.

BRIEF DESCRIPTION OF THE DRAWINGS

FIGS. 7A and 7B are sectional views of a reader.
FIGS. 8A and 8B are sectional views of a reader.
FIGS. 9A-9F are schematic diagrams of steps in fabricating a reader.

DETAILED DESCRIPTION OF ILLUSTRATIVE EMBODIMENTS

Figure 1:
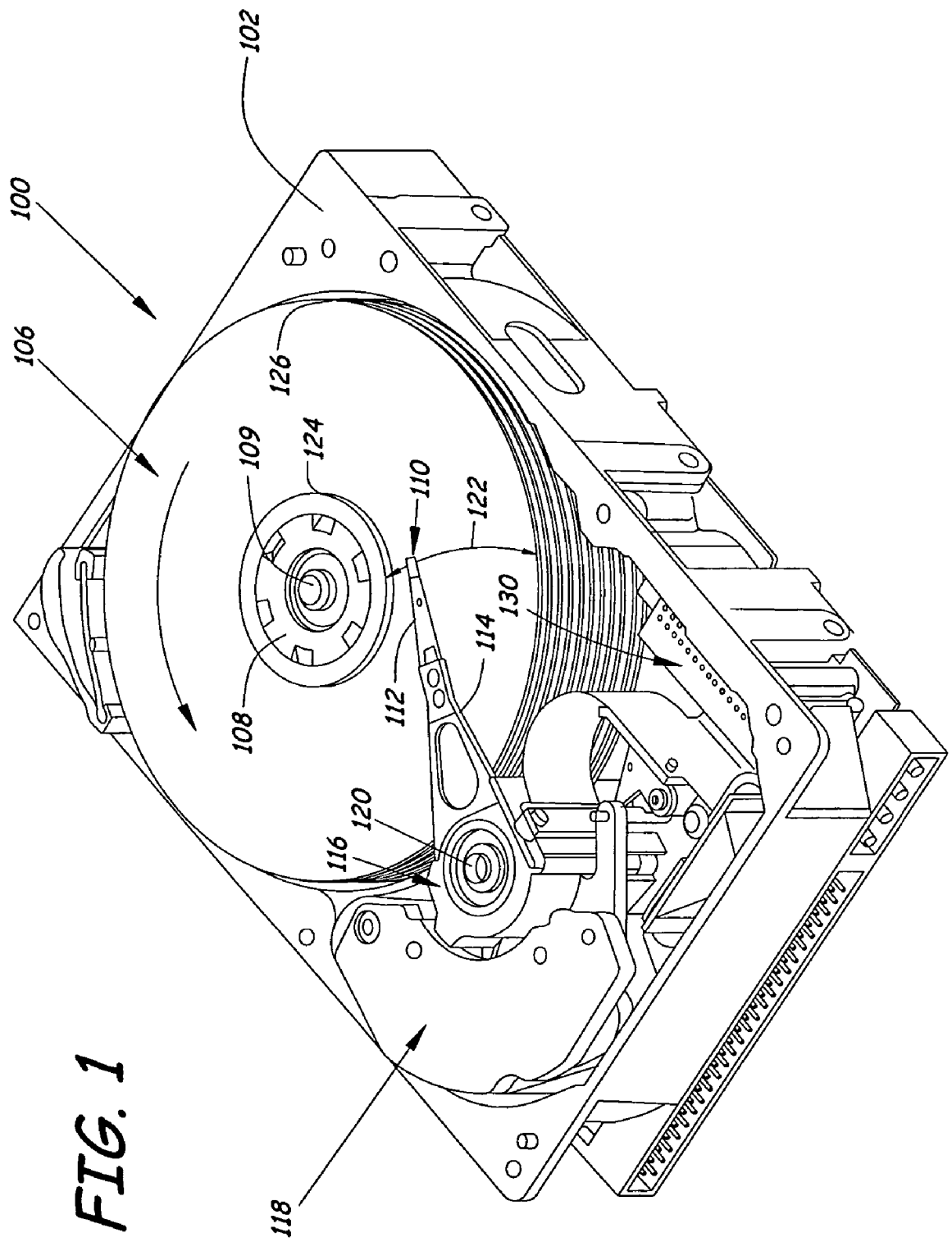
FIG. 1 is an isometric view of a disc drive.

FIG. 1 is a perspective view of a disc drive 100 in which the present invention is useful. Disc drive 100 can be configured as a traditional magnetic disc drive, a magneto-optical disc drive or an optical disc drive, for example. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs 107, which are mounted for co-rotation about central axis 109. A single individual disc can also be used. Each disc surface has an associated slider 110, which is mounted to disc drive 100 and carries a read/write head for communication with the disc surface.

In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached sliders 110 about a pivot shaft 120 to position sliders 110 over a desired data track along a path 122 between a disc inner diameter 124 and a disc outer diameter 126. Voice coil motor 118 operates under control of internal circuitry 130. Other types of actuators can also be used, such as linear actuators.

The read/write head carried by slider 110 includes a reader for reading data from an associated disc and a writer for writing data to an associated disc 107. Several configurations for a reader carried by slider 110 are described below. Elements of a reader can be of different shapes and sizes as well as be positioned differently with respect to other elements. The reader can include a magnetoresistive sensor based on the extraordinary Hall effect.

Figure 2:
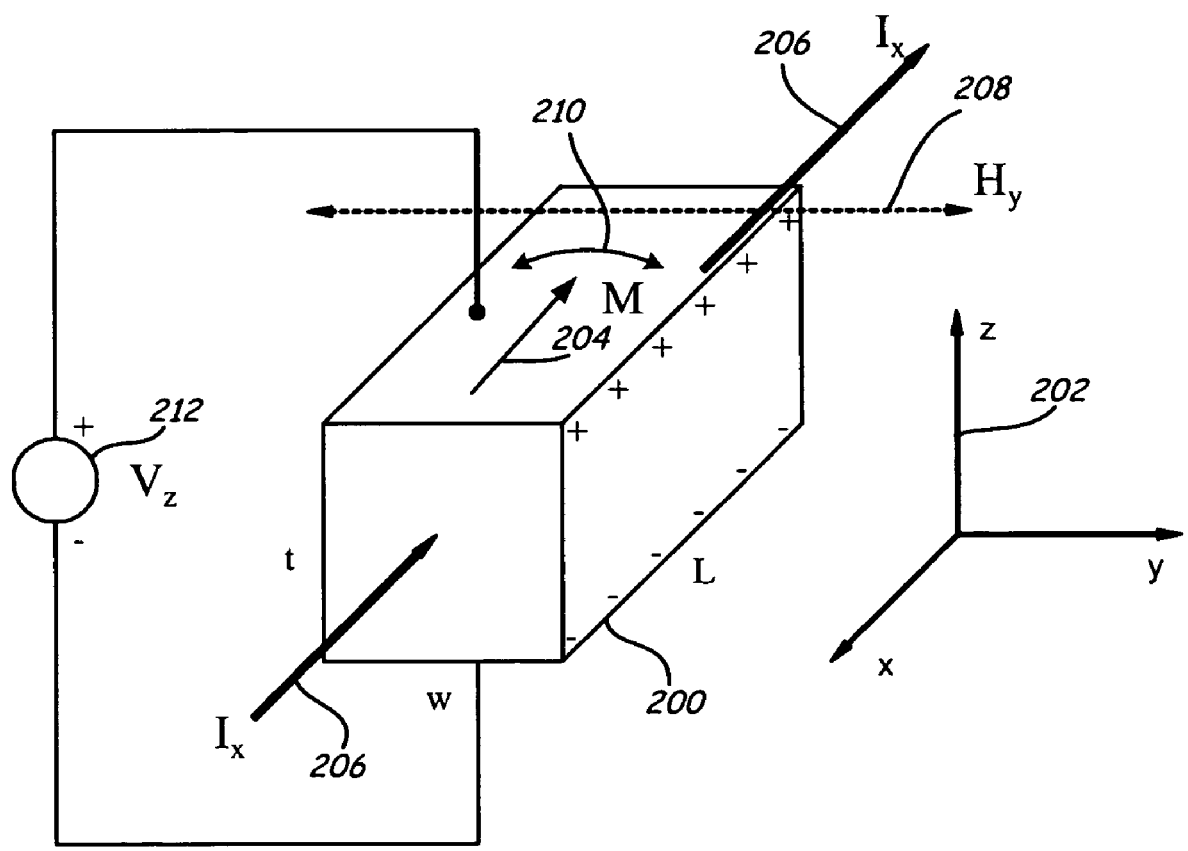
FIG. 2 is a schematic diagram illustrating the extraordinary hall effect.

FIG. 2 is a schematic diagram of a device to measure extraordinary Hall voltage. A rectangular ferromagnetic metallic material 200 is positioned in a Cartesian space having an xyz axis 202. Rectangular ferromagnetic material 200 is magnetized in the negative x-direction, illustrated as arrow 204. A current, illustrated by arrow 206, passes through material 200 along the x-axis. A magnetic field 208, acting along the y-axis, causes the magnetization of material 200 to rotate, resulting in a net magnetization component 210 along the y-axis. The current 206 and y-axis magnetization component 210 induce a voltage 212 along the z-axis. Voltage 212 is known as the extraordinary Hall voltage. It is worth noting that current 206, y-axis magnetization component 210 and voltage 212 are mutually orthogonal.

Ferromagnetic material 200 exhibits a large Hall resistivity and can include iron platinum (FePt) alloys. Additionally, material 200 can, as examples, include any combinations of cobalt, nickel, iron, holmium, platinum, osmium, bismuth, boron, dysprosium, gadolinium, and terbium. The material need not form a single layer, but can include multiple layers. Multiple layers can allow for a differential sensor. For example, a Terfenol-D, tantalum, FePt multilayer sensor will produce a Hall signal only when the sensor is positioned over a group of two adjacent bits that rotate magnetization of the Terfenol-D and FePt layers in opposite directions. Otherwise, a null voltage occurs when the magnetizations of the Terfenol-D and FePt layers rotate in the same direction. Additionally, a height (h), width (w) and length (l) of material 200 can be chosen to maximize a Hall resistivity value for material 200. Furthermore, the height, width and length can be modified to reduce resistance in one or more directions, reduce power consumption, decrease current density and improve magnetic sensitivity.

The components of the extraordinary Hall effect device of FIG. 2 can be implemented as the reader in the read/write head carried by a slider. The readers can be coupled to a substrate such as slider 110 that includes a bearing surface facing an associated storage medium. The letters ABS in the figures indicate this bearing surface. In this case, the xz-plane is parallel to a surface of the slider that faces an associated disc surface. The z-axis is a direction of travel for the associated disc and voltage 212 is indicative of magnetic flux from the associated disc.

The reader can further be used with or without magnetic shields, as desired. Additionally, the reader can be positioned at or recessed from the surface of the slider facing the storage medium. Various readers are discussed below that utilize the components and materials discussed above to sense data using the extra-ordinary Hall effect. In particular, the readers include a ferromagnetic bar that can include the materials and/or combinations of materials discussed above. Furthermore, the readers include a power source for providing current to the ferromagnetic bar and a sensor to sense the extraordinary Hall effect voltage. Additionally, the readers can be made of different sizes depending on a corresponding media. A length in a down track direction of an associated media can be in a rough range of 5 to 50 nanometers. A width in a cross track direction and a height in a direction away from a bearing surface can be in the range of 10 to 100 nanometers. However, other dimensions can also be used.

Figure 3:
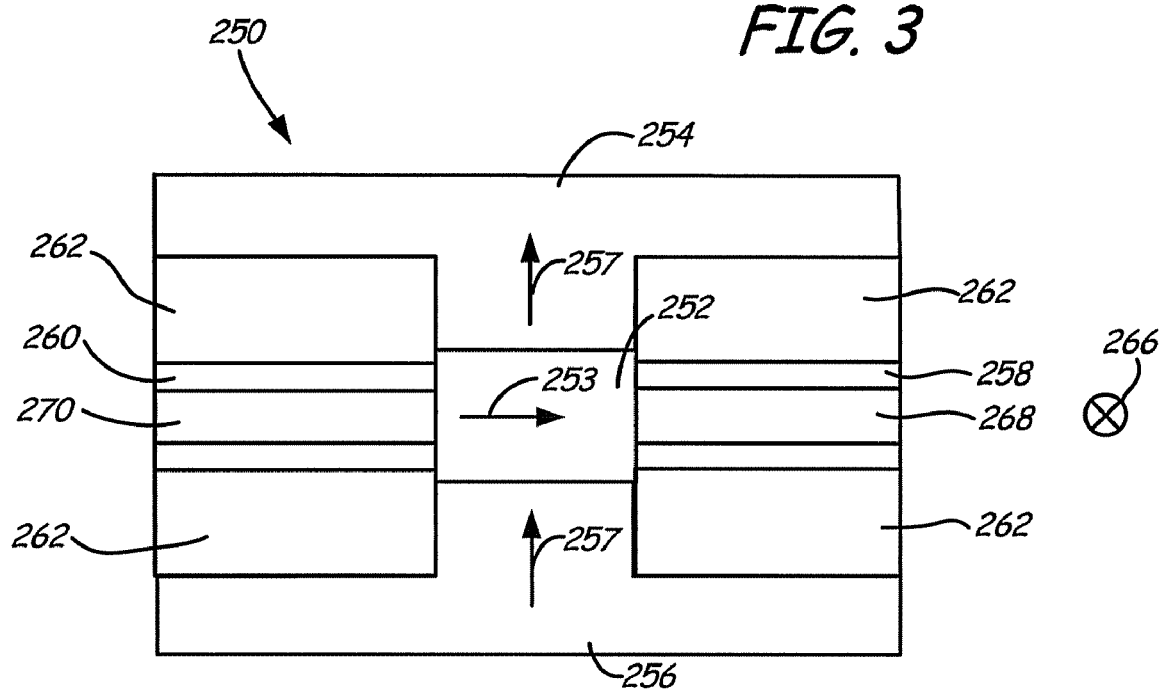
FIG. 3 is a schematic diagram of a reader.

FIG. 3 is a schematic view of an exemplary reader 250 from a surface of a storage medium. Reader 250 utilizes the extraordinary Hall effect to sense data stored on the storage medium. Reader 250 includes a ferromagnetic bar 252 and current leads 254 and 256. Ferromagnetic metallic bar 252 can be made of a material having a large Hall resistivity, as discussed above, and has a magnetic moment in a direction 253. Current leads 254 and 256 provide a current 257 to ferromagnetic bar 252 orthogonal to magnetic moment direction 253. Additionally, reader 250 includes voltage leads 258 and 260. Insulating material 262 separates current leads 254 and 256 from voltage leads 258 and 260. Magnetization component 253 is orthogonal to a magnetization component of an associated media. The direction of magnetization of the media is shown at 266 (into the page). Reader 250 senses magnetization on the medium using voltage leads 258 and 260 according to the extraordinary Hall effect discussed above with relation to FIG. 2. Voltage leads 258 and 260 can include permanent magnets 268 and 270 to provide magnetic biasing for ferromagnetic bar 252.

Figure 4:
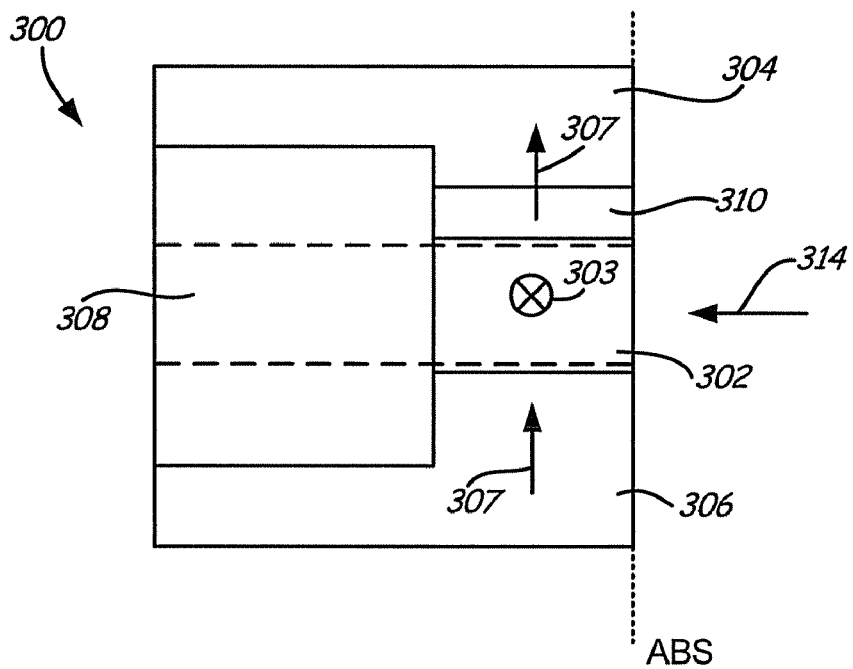
FIG. 4 is a sectional view of a reader.

FIG. 4 is a cross sectional view of a reader 300. Reader 300 includes a ferromagnetic metallic bar 302 and current leads 304 and 306. Bar 302 includes a magnetization component in a direction shown at 303 (into the page). Current leads 304 and 306 provide a current 307 orthogonal to direction 303. Voltage leads 308 are provided on either side of bar 302 and are shown in dashed lines to sense a Hall voltage within bar 302. Biasing component 310 biases bar 302 in direction 303. Direction 303 is orthogonal to a magnetization of an associated media, shown at 314.

Figure 5A:
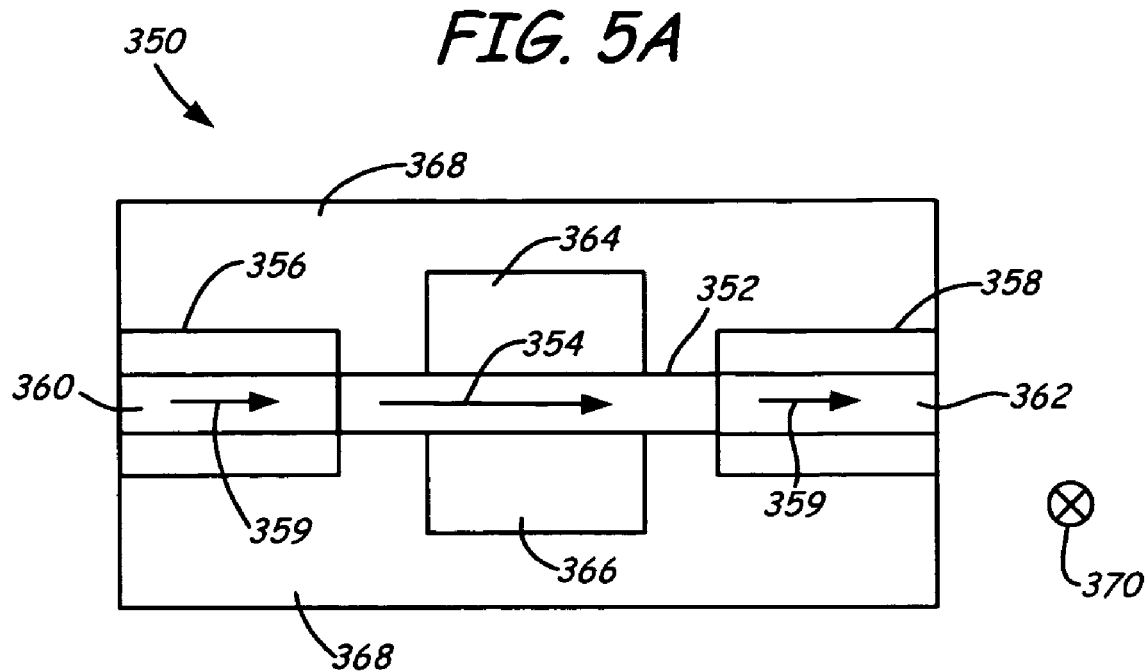
FIG. 5A is a schematic diagram of a reader.
Figure 5B:
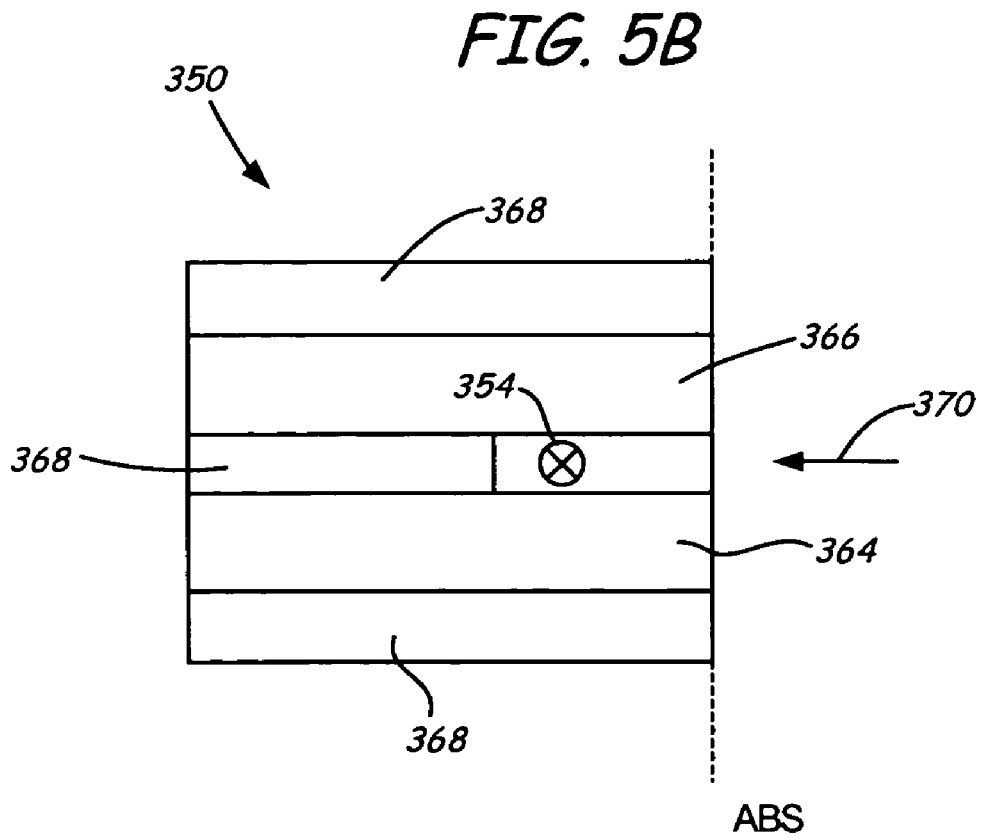
FIG. 5B is a sectional view of the reader illustrated in FIG. 5A.

FIGS. 5A and 5B illustrate another reader 350. Reader 350 includes a ferromagnetic metallic bar 352 having a direction of magnetization 354. Current leads 356 and 358 induce a current 359 in bar 352. Furthermore, current leads 356 and 358 can include permanent magnets 360 and 362, which bias ferromagnetic bar 352. Reader 350 further includes voltage leads 364 and 366 that measure the extraordinary Hall voltage experienced by ferromagnetic bar 352. Insulation material 368 can be provided to electrically isolate components of reader 350. Direction 354 is orthogonal to a direction of magnetization 370 of an associated media.

Figure 6A:
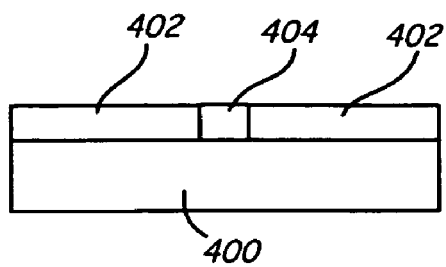
FIGS. 6A-6F are schematic diagrams of steps to fabricate a reader.
Figure 6B:
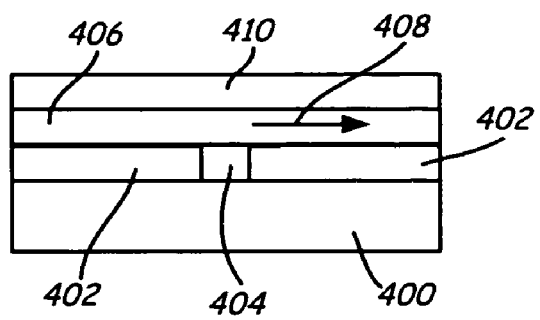
Figure 6C:
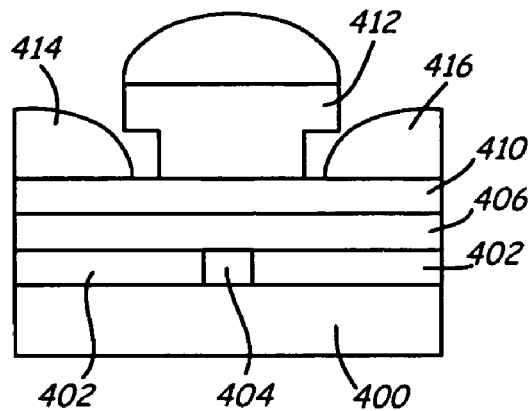
Figure 6D:
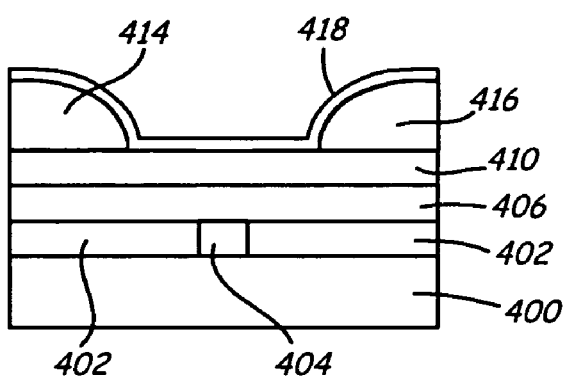
Figure 6E:
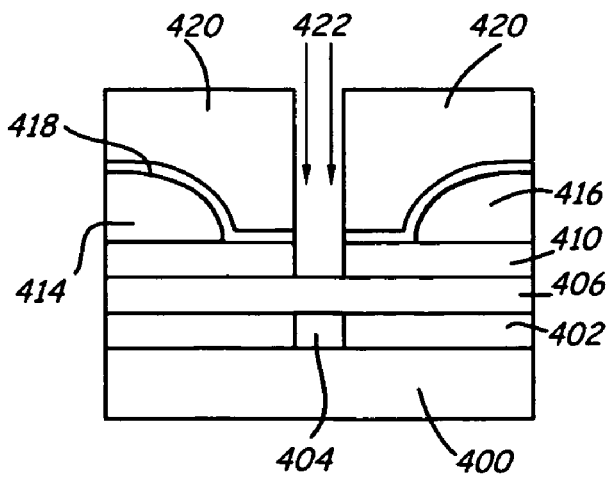
Figure 6F:
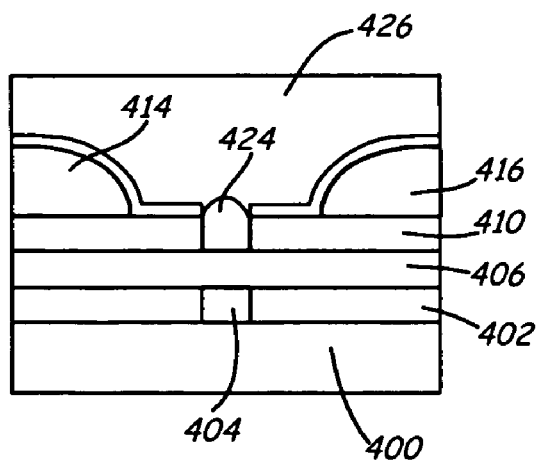

FIGS. 6A-6F illustrate steps for fabricating a reader. FIG. 6A illustrates a shield 400. Insulating material 402 and a first voltage lead 404 have been deposited on shield 400. In FIG. 6B, a ferromagnetic layer 406 having a direction of magnetization 408 is deposited on insulating material 402 and voltage lead 404. Additionally, an anti-ferromagnetic material 410 is deposited on ferromagnetic material 406. An exchange coupling between ferromagnetic material 406 and anti-ferromagnetic material 410 bias ferromagnetic material 406 in direction 408. In FIG. 6C, a photoresist portion 412 is used to define current leads 414 and 416. In FIG. 6D, insulating material 418 is deposited on current leads 414 and 416 as well as a portion of anti-ferromagnetic layer 410. In FIG. 6E, a photoresist layer material 420 is applied on insulating material 418 and a trench 422 is etched into insulating material 418 and anti-ferromagnetic material 410. A voltage lead 424 is then deposited in trench 422 and a shield is deposited on insulating component 418 and voltage lead 424, as shown in FIG. 6F.

Figure 6G:
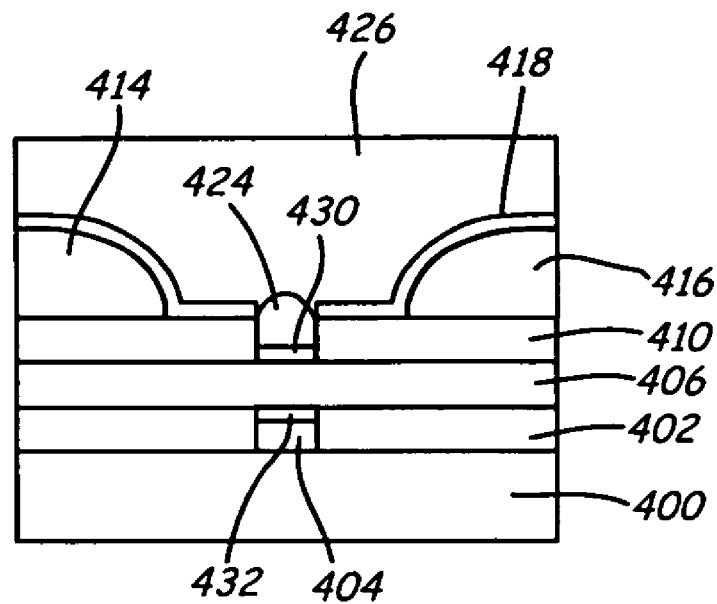
FIGS. 6G and 6H are schematic diagrams of alternative embodiments of the reader illustrated in FIG. 6F.
Figure 6H:
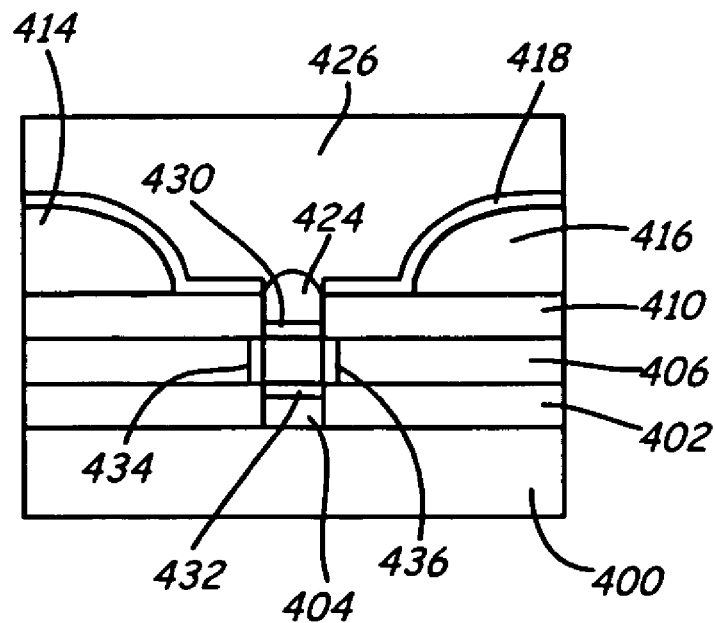

FIGS. 6G and 6H illustrate alternative readers to the reader illustrated in FIG. 6F. FIG. 6G illustrates high resistivity portions 430 and 432 positioned at ends of voltage leads 404 and 424 and proximate ferromagnetic layer 406. The high resistivity portions 430 and 432 can reduce current shunting within the reader that can reduce the Hall signal. Additionally, low resistivity portions of leads 404 and 424 can reduce overall lead resistance, which can thus reduce noise and power dissipation. FIG. 6H illustrates additional high resistivity portions 434 and 436.

FIGS. 7A and 7B illustrate a reader 500. FIG. 7A is a cross sectional side view of reader 500 and FIG. 7B is a cross sectional top view of reader 500. Reader 500 includes a ferromagnetic metallic bar 502. In FIG. 7A, ferromagnetic bar 502 is surrounded by insulating material 504 and shields 506 and 508. Voltage leads 510 and 512 are coupled to ferromagnetic bar 502 to sense a Hall voltage therein. As shown in FIG. 7B, ferromagnetic bar 502 is also coupled to anti-ferromagnetic layers 514 and 516. Furthermore, current leads 518 and 520 are coupled to anti-ferromagnetic layers 514 and 516 respectively. Current leads 518 and 520 cause a current 522 to flow within ferromagnetic bar 502.

FIGS. 8A and 8B illustrate another reader 550. FIG. 8A is a side view of a cross section of reader 550 and FIG. 8B is a top view of a cross section of reader 550. Reader 550 includes a ferromagnetic bar 552. Insulating material 554 is provided to insulate ferromagnetic bar 552 from other components of reader 550. Reader 550 also includes shields 556 and 558. Voltage leads 560 and 562 are coupled to ferromagnetic bar 552. As is shown in FIGS. 8A and 8B, ferromagnetic bar 552 is of a smaller height than voltage leads 560 and 562, creating an offset 563. Alternatively, ferromagnetic bar 552 can be of similar height to voltage leads 560 and 562. As shown in FIG. 8B, ferromagnetic bar 552 is coupled to anti-ferromagnetic layers 564 and 566. Additionally, current leads 568 and 570 provide current 572 through ferromagnetic bar 552.

FIGS. 9A-9F illustrate steps for building another reader. FIG. 9A illustrates a shield 600, an insulating layer 602, a conductive layer 604 and a second insulating layer 606. In FIG. 9B, photoresist portion 608 and 610 are deposited on second insulating layer 606. In FIG. 9C, a trench 612 is etched down to shield 600. In FIG. 9D, a ferromagnetic bar 614 has been deposited in trench 612 with a conductive layer 616 surrounding ferromagnetic bar 614. In FIG. 9E, a second shield 618 has been deposited on insulating layer 606 and conductive portion 616. A current 620 can be applied through ferromagnetic bar 614 such that conductive portion 622 and 624 serve as voltage leads. FIG. 9F illustrates an alternative to FIG. 9E, wherein permanent magnets 626 and 628 serve as current leads and provide magnetic biasing for ferromagnetic bar 614 such that a magnetic moment 630 is formed therein.

Figure 10:
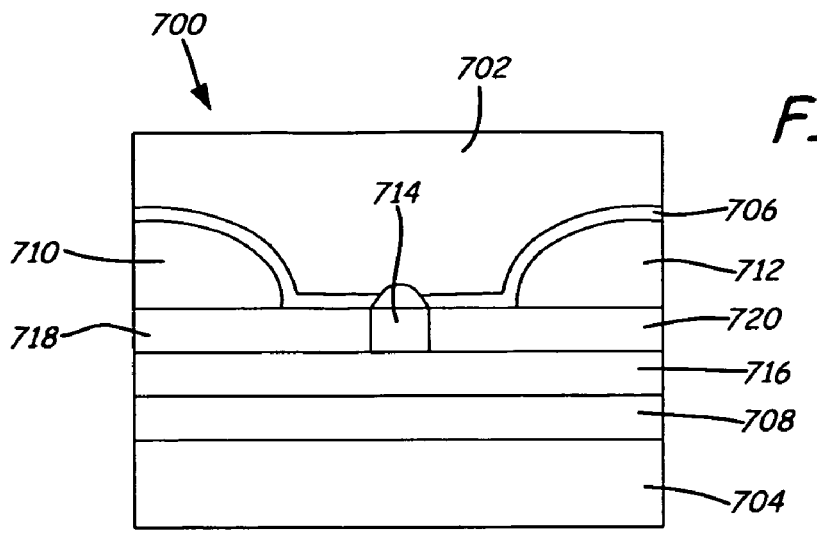
FIG. 10 is a schematic diagram of a reader.

FIG. 10 is an alternative embodiment of a reader. Reader 700 includes shields 702 and 704. Insulating layers 706 and 708 are coupled to shields 702 and 704, respectively. Reader 700 also includes current lead 710, current lead 712 and a single voltage lead 714. Additionally, reader includes a ferromagnetic metallic bar 716 coupled to anti-ferromagnetic portions 718 and 720. With reader 700, the Hall effect voltage is measured between voltage leads 714 and either current lead 710 or current lead 712. In this case, only one voltage lead is necessary to sense magnetic flux on an associated storage medium.

Figure 11:
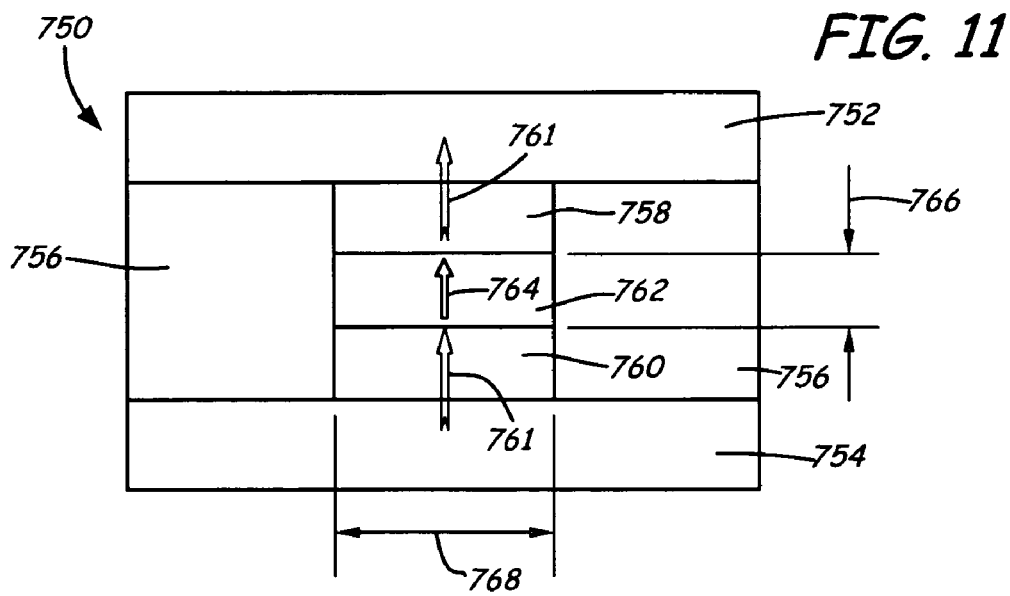
FIG. 11 is a schematic diagram of a reader.

FIG. 11 illustrates an alternative reader 750. Reader 750 includes shields 752 and 754. Additionally, reader 750 includes insulating material 756. A first current lead 758 and second current lead 760 are adapted to provide current 761 to a ferromagnetic bar 762. Ferromagnetic metallic bar 762 includes a magnetic moment 764. In this embodiment, a thickness 766 of ferromagnetic bar 762 is smaller than a width 768. In this case, the Hall voltage can be measured using current leads 758 and 760.

Figure 12:
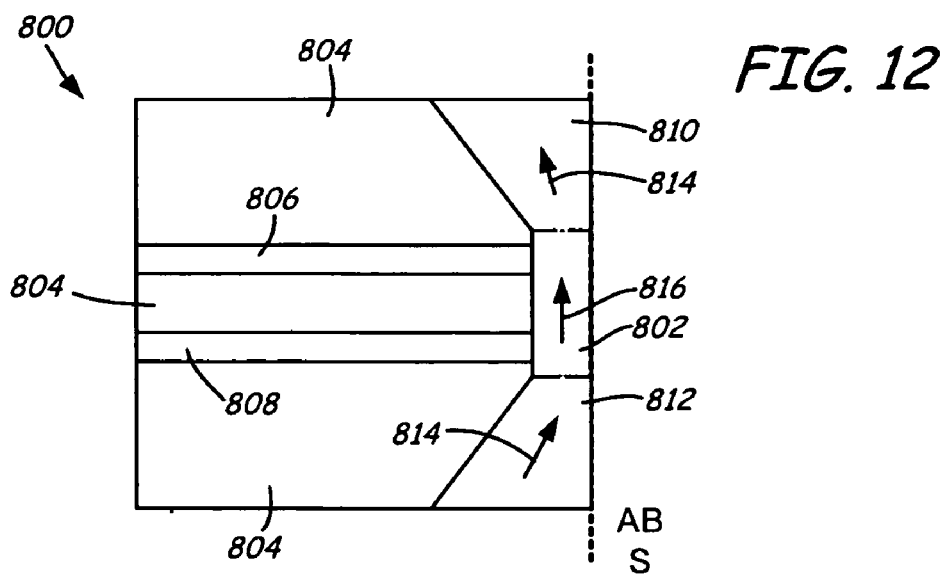
FIG. 12 is a schematic sectional view of a reader.

FIG. 12 is an alternative reader 800 including a ferromagnetic metallic bar 802, insulating material 804, voltage leads 806 and 808 and anti-ferromagnetic portions 810 and 812. Current 814 passes through anti-ferromagnetic portion 812 to anti-ferromagnetic portion 810. Ferromagnetic bar 802 includes a magnetic moment 816 such that a Hall effect voltage can be sensed by voltage leads 806 and 808.

Figure 13A:
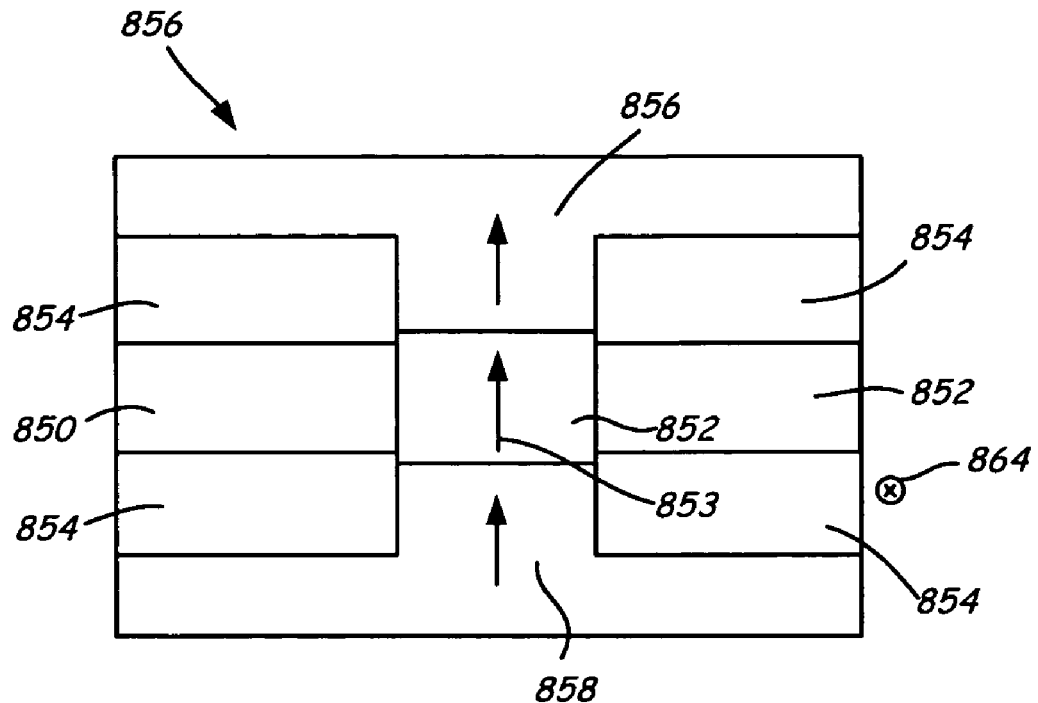
FIGS. 13A and 13B are schematic diagrams of a reader.
Figure 13B:
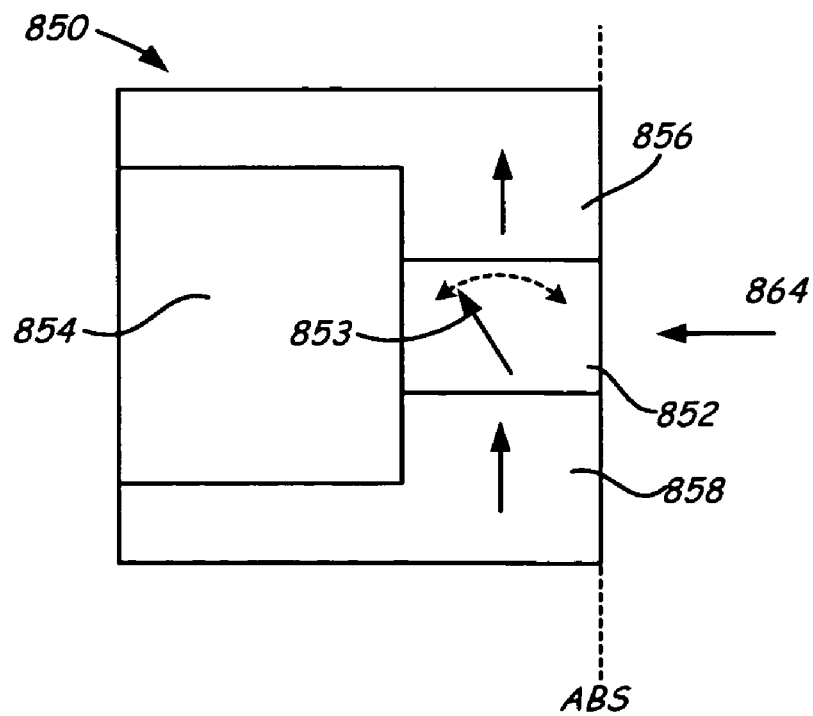

FIGS. 13A and 13B illustrate an alternative reader 850 including a ferromagnetic metallic bar 852 having perpendicular magnetic anisotropy that creates a magnetic moment shown at 853. Magnetic bar 852 includes an intrinsic anisotropy that tends to align magnetization along a favored crystallographic direction. Perpendicular magnetic anisotropy refers to the situation where the favored direction is perpendicular to a plane of a ferromagnetic film. In the embodiment illustrated, this direction is shown at 853. Reader 850 also includes current leads 856 and 858 as well as voltage leads 860 and 862. Magnetic flux 864 from an associated storage medium induces a rotation of magnetization moment 853 towards or away from an air-bearing surface of reader 850. This rotation induces a Hall voltage that can be detected by voltage leads 860 and 862. Since ferromagnetic bar 852 is stabilized by the perpendicular magnetic anisotropy, there is no need for reader 850 to include biasing and/or stabilization elements, such as permanent magnets or anti-ferromagnetic magnets.

Figure 14A:
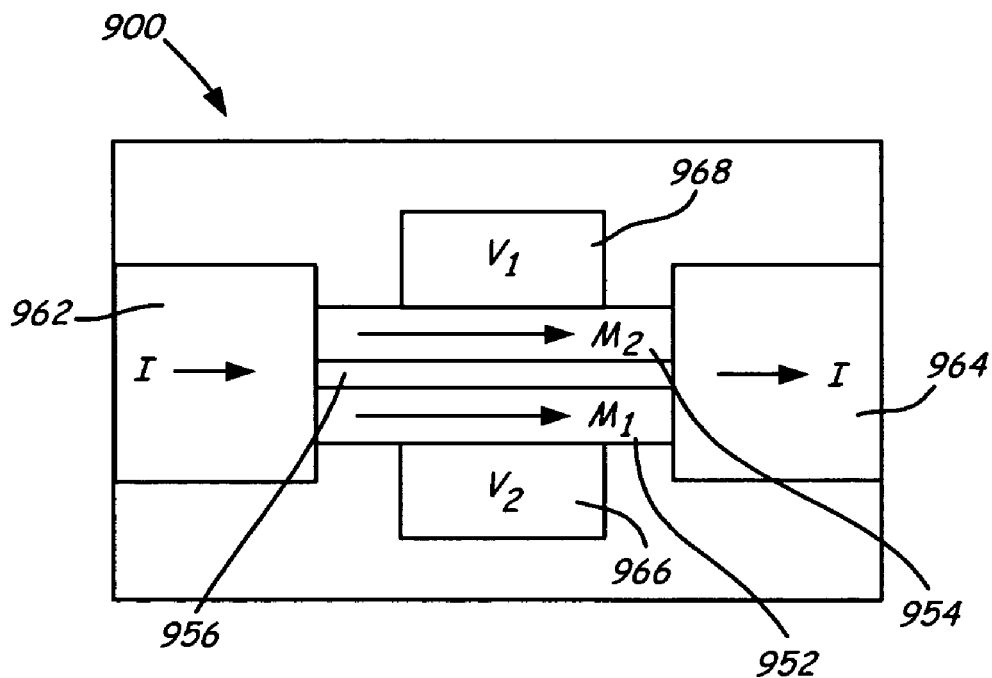
FIGS. 14A and 14B are schematic diagrams of a reader.
Figure 14B:
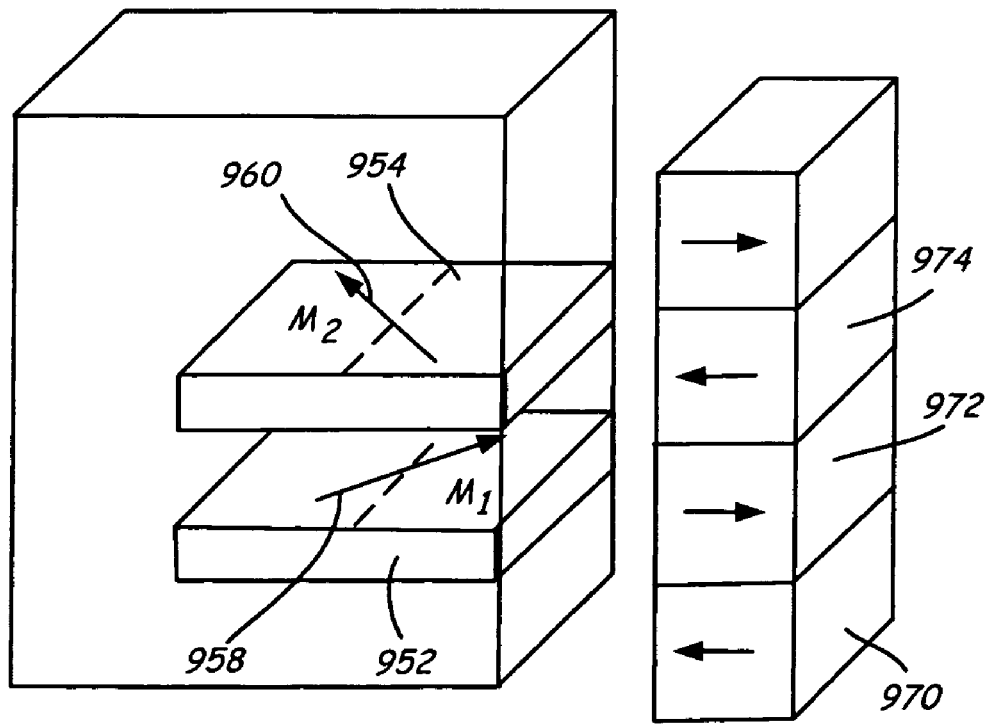

FIGS. 14A and 14B illustrate an alternative reader 900. In the embodiment illustrated, reader 900 includes a first ferromagnetic layer 952 and a second ferromagnetic layer 954 formed of different ferromagnetic materials. First layer 952 and second layer 954 are spaced apart by a non-magnetic spacer layer 956. First ferromagnetic layer 952 has a net magnetic moment 958 and second ferromagnetic layer 954 includes a magnetic moment 960. Current leads 962 and 964 provide current to first layer 952 and second layer 954. Additionally, voltage leads 966 and 968 are coupled to first layer 952 and second layer 954, respectively.

Materials for first layer 952 and second layer 954 can be chosen such that the layers exhibit opposing Hall resistivity versus field curves. For example, Terfenol-D and FePt exhibit opposite Hall resistance versus field curves. A Hall resistance value for Terfenol-D tends to decrease for higher positive magnetic field strengths. In contrast, FePt tends to have a higher Hall resistance value for higher positive magnetic field strengths.

When materials for first layer 952 and second layer 954 have opposite Hall resistance verses field curves, a differential sensor is created. When positioned over magnetic transitions on a media 970, as illustrated in FIG. 14B, a Hall signal will only be produced (and thus detected by voltage leads 966 and 968) when first layer 952 and second layer 954 are positioned over a di-bit (two adjacent bits) that rotates magnetization in opposite directions. For example, as shown in FIG. 14B, bits 972 and 974 possess different directions of magnetization, which will produce a Hall effect signal.

Figure 15A:
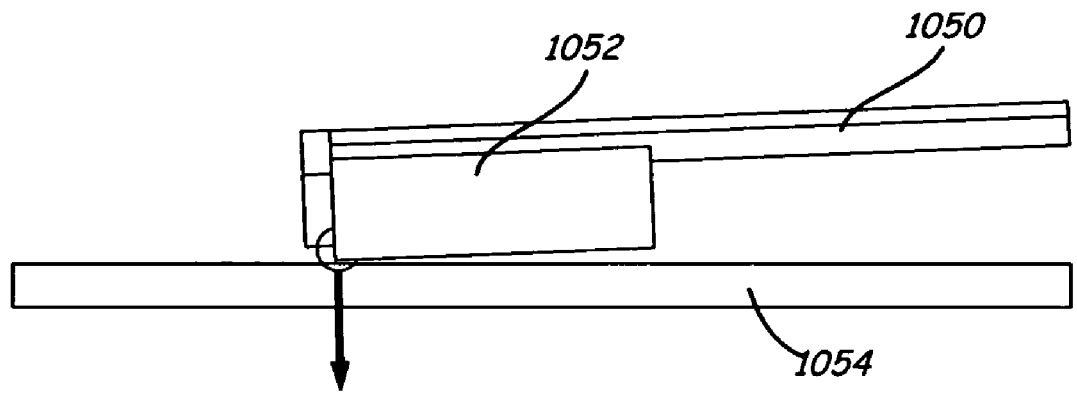
FIGS. 15A and 15B are schematic diagrams of a Hall effect sensor for sensing a magnetic field produced by a writer.
Figure 15B:
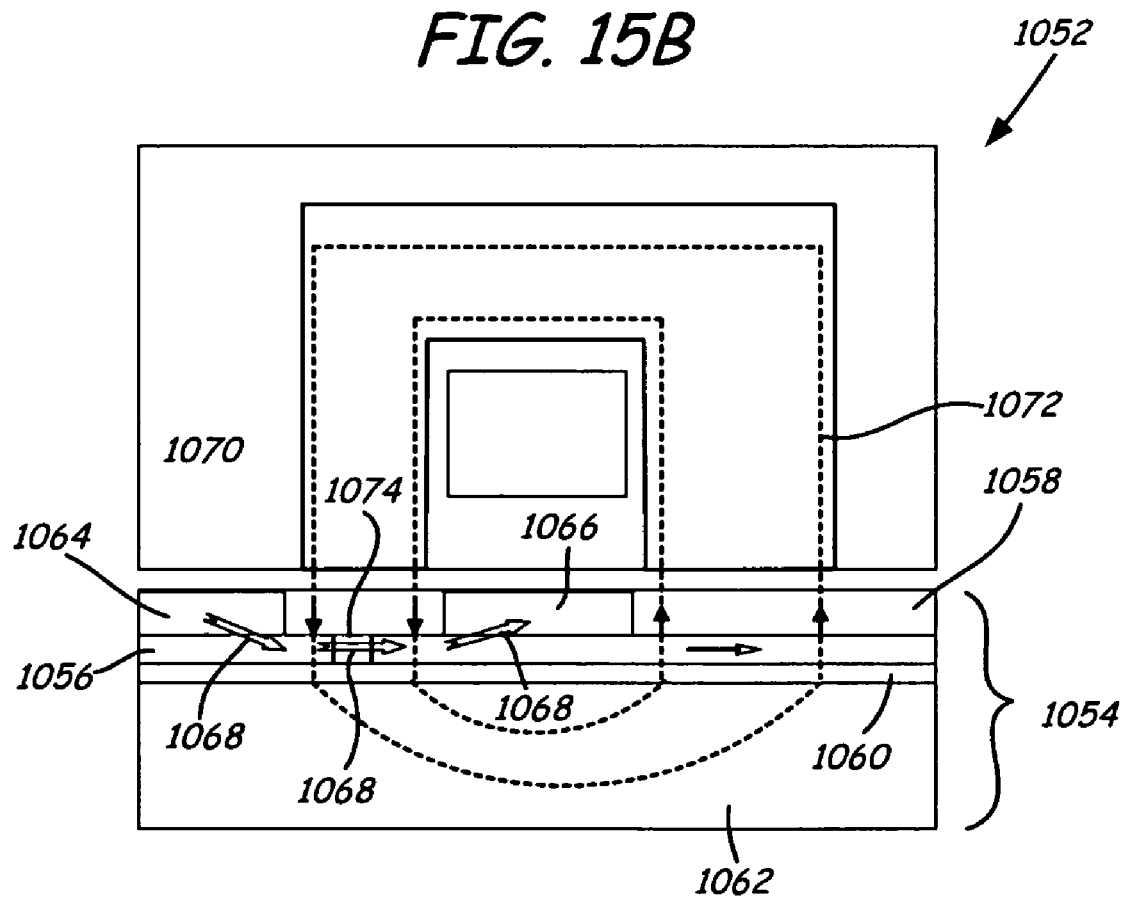

FIGS. 15A and 15B illustrate an alternative application for utilizing a Hall effect sensor for sensing a magnetic field produced by a writer in a recording head. A suspension 1050 suspends a substrate 1052 over a wafer 1054 that has a Hall effect sensor built onto it. As illustrated in FIG. 15B, a ferromagnetic layer 1056 is integrated onto the wafer 1054. Wafer 1054 also includes insulating layers 1058 and 1060 as well as a soft under layer 1062. Conductive elements 1064 and 1066 can be coupled to ferromagnetic layer 1056 such that a current 1068 can pass therethrough.

A write pole 1070 applies a magnetic filed (illustrated by dashed lines 1072) to wafer 1054 to alter magnetic transitions thereon. An extraordinary Hall voltage can be sensed by coupling voltage leads to ferromagnetic layer 1056. For example, voltage leads 1074 can be coupled to either side of ferromagnetic layer 1056 to sense the extraordinary Hall voltage. As a result, the magnetic field between write pole 1070 and soft underlayer 1062 can be sensed.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

For example, the particular elements may vary depending on the particular application for the magnetic read/write head system while maintaining substantially the same functionality without departing from the scope and spirit of the present invention. In addition, although the embodiments described herein are directed to a reader for data storage, it will be appreciated by those skilled in the art that the teachings of the present invention can be applied to other systems without departing from the scope and spirit of the present invention.

What is claimed is:
1. A device, comprising:
an air bearing surface;
a substrate;

a metallic ferromagnetic element coupled to the substrate, the element including a first ferromagnetic material and a second ferromagnetic material different from the first ferromagnetic material, wherein the first ferromagnetic material exhibits an opposite Hall resistance versus field curve than the second ferromagnetic material, the first ferromagnetic material having a magnetization direction oriented along a first plane and the second ferromagnetic material having a magnetization direction oriented along a second plane, wherein the first and second planes are substantially perpendicular to the air bearing surface;

first and second current leads coupled to the ferromagnetic element; and first and second voltage leads coupled to the ferromagnetic element.

2. The device of claim 1 further comprising a non-magnetic spacer layer positioned between the first ferromagnetic material and the second ferromagnetic material.

3. The device of claim 1 wherein the first and second voltage leads each include a low resistivity portion and a high resistivity portion, where the high resistivity portion is adjacent to the ferromagnetic element.

4. The device of claim 1 wherein the first and second current leads are adapted to provide current to the ferromagnetic element and wherein the first and second voltage leads are adapted to sense a voltage in the ferromagnetic element.

5. The device of claim 4 wherein a direction of the current is orthogonal to a component of magnetization induced within the ferromagnetic element by a magnetic field and wherein the current induces a voltage in a direction mutually orthogonal to the direction of the current and the component of magnetization.

6. The device of claim 1 wherein the ferromagnetic element includes at least two of iron, cobalt, nickel, platinum, boron, bismuth and a rare earth element.

7. The device of claim 1 wherein the current leads include a magnetic biasing component to magnetically bias the ferromagnetic element.

8. The device of claim 1 wherein the voltage leads include a biasing component to bias the ferromagnetic element.

9. The device of claim 1 wherein the first and second current leads each include a high resistivity portion and a low resistivity portion, where the high resistivity portion is adjacent to the ferromagnetic element.

10. A device comprising:
a body having an air bearing surface;
a metallic ferromagnetic bar coupled to the body;
first and second current leads coupled to the body and adapted to provide current to the ferromagnetic bar; and
first and second voltage leads coupled to the body and adapted to sense a voltage in the ferromagnetic bar, wherein the first and second voltage leads each include a low resistivity portion and a high resistivity portion that is adjacent to the ferromagnetic bar, and wherein at least one of the voltage leads and current leads include a magnetic biasing component to magnetically bias the ferromagnetic bar.

11. The device of claim 10 wherein the first and second current leads each include a low resistivity portion and a high resistivity portion that is adjacent to the ferromagnetic bar.

12. The device of claim 10 wherein a direction of the current is orthogonal to a component of magnetization induced within the ferromagnetic bar by a magnetic field, wherein the current induces a voltage in a direction mutually orthogonal to the direction of the current and the component of magnetization.

13. The device of claim 10 wherein the ferromagnetic bar includes a first ferromagnetic layer and a second ferromagnetic layer, the second ferromagnetic layer having a different material than the first ferromagnetic layer.

14. The device of claim 10 wherein the ferromagnetic bar includes a perpendicular magnetic anisotropy with respect to at least one of the current and voltage leads.

15. A data storage system, comprising:
a wafer having a metallic ferromagnetic layer and a soft under layer;
a substrate positioned above the wafer and having a bearing plane facing the wafer;
a transducer coupled to the substrate and adapted to apply a magnetic field to the wafer;
a power source coupled to the ferromagnetic layer to provide current thereto;
a sensor coupled to the ferromagnetic layer to sense a voltage induced by the magnetic field applied by the transducer.

16. The data storage system of claim 15 wherein the power source includes first and second current leads coupled to the ferromagnetic layer.

17. The data storage system of claim 15 wherein the sensor includes first and second voltage leads coupled to the ferromagnetic layer.

18. The data storage system of claim 15 further comprising an insulating layer positioned between the ferromagnetic layer and the soft under layer.

19. The data storage system of claim 15 wherein the ferromagnetic layer includes a first ferromagnetic material and a second ferromagnetic material, the second ferromagnetic material being different than the first ferromagnetic material.

20. The data storage system of claim 15 further comprising a magnetic biasing component to magnetically bias the ferromagnetic layer.

21. The device of claim 1, wherein the air bearing surface faces a moving storage medium, and wherein each of the first ferromagnetic material and the second ferromagnetic material are positioned along the air bearing surface.

* * * * *

UNITED STATES PATENT AND TRADEMARK OFFICE
CERTIFICATE OF CORRECTION

PATENT NO.       : 7,576,948 B2                                            Page 1 of 1
APPLICATION NO.  : 11/360243
DATED            : August 18, 2009
INVENTOR(S)      : Covington et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 572 days.

Signed and Sealed this

Seventh Day of September, 2010

David J. Kappos
*Director of the United States Patent and Trademark Office*